United States Patent
Wu

(10) Patent No.: US 10,629,579 B2
(45) Date of Patent: Apr. 21, 2020

(54) PACKAGE-ON-PACKAGE WITH CAVITY IN INTERPOSER

(71) Applicant: Taiwan Semiconductor Manufacturing Company, Ltd., Hsinchu (TW)

(72) Inventor: Jiun Yi Wu, Zhongli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/859,843

(22) Filed: Jan. 2, 2018

(65) Prior Publication Data

US 2018/0151549 A1    May 31, 2018

Related U.S. Application Data

(63) Continuation of application No. 14/819,006, filed on Aug. 5, 2015, now Pat. No. 9,865,580, which is a
(Continued)

(51) Int. Cl.
*H01L 25/00* (2006.01)
*H01L 25/10* (2006.01)
(Continued)

(52) U.S. Cl.
CPC ............ *H01L 25/50* (2013.01); *H01L 23/145* (2013.01); *H01L 23/49816* (2013.01); *H01L 23/49827* (2013.01); *H01L 23/49833* (2013.01); *H01L 25/105* (2013.01); *H01L 23/3128* (2013.01); *H01L 24/13* (2013.01);

*H01L 24/16* (2013.01); *H01L 24/32* (2013.01); *H01L 24/48* (2013.01); *H01L 24/73* (2013.01); *H01L 24/81* (2013.01); *H01L 24/92* (2013.01); *H01L 25/0657* (2013.01); *H01L 2224/0401* (2013.01); *H01L 2224/131* (2013.01);
(Continued)

(58) Field of Classification Search
CPC ... H01L 25/50; H01L 24/48; H01L 23/49833; H01L 24/16; H01L 24/32; H01L 24/81; H01L 24/13; H01L 24/92; H01L 25/0657; H01L 23/145; H01L 23/49816; H01L 23/49827
See application file for complete search history.

(56) References Cited

U.S. PATENT DOCUMENTS 8,052,015 B2    11/2011  Huang
2008/0258285 A1    10/2008  Harper et al.
(Continued)

*Primary Examiner* — Ahmed N Sefer
(74) *Attorney, Agent, or Firm* — Slater Matsil, LLP

(57) ABSTRACT

A package includes an interposer, which includes a core dielectric material, a through-opening extending from a top surface to a bottom surface of the core dielectric material, a conductive pipe penetrating through the core dielectric material, and a device die in the through-opening. The device die includes electrical connectors. A top package is disposed over the interposer. A first solder region bonds the top package to the conductive pipe, wherein the first solder region extends into a region encircled by the conductive pipe. A package substrate is underlying the interposer. A second solder region bonds the package substrate to the interposer.

20 Claims, 7 Drawing Sheets

Related U.S. Application Data continuation of application No. 14/158,295, filed on Jan. 17, 2014, now Pat. No. 9,111,930.

(60) Provisional application No. 61/778,241, filed on Mar. 12, 2013.

(51) Int. Cl.
    *H01L 23/14* (2006.01)
    *H01L 23/498* (2006.01)
    *H01L 23/31* (2006.01)
    *H01L 23/00* (2006.01)
    *H01L 25/065* (2006.01)

(52) U.S. Cl.
    CPC .......... *H01L 2224/16225* (2013.01); *H01L 2224/32145* (2013.01); *H01L 2224/32225* (2013.01); *H01L 2224/45015* (2013.01); *H01L 2224/48091* (2013.01); *H01L 2224/48227* (2013.01); *H01L 2224/48228* (2013.01); *H01L 2224/48464* (2013.01); *H01L 2224/73204* (2013.01); *H01L 2224/73265* (2013.01); *H01L 2224/81193* (2013.01); *H01L 2224/81815* (2013.01); *H01L 2224/92125* (2013.01); *H01L 2225/0651* (2013.01); *H01L 2225/06565* (2013.01); *H01L 2225/107* (2013.01); *H01L 2225/1023* (2013.01); *H01L 2225/1041* (2013.01); *H01L 2225/1058* (2013.01); *H01L 2924/00014* (2013.01); *H01L 2924/15311* (2013.01); *H01L 2924/15331* (2013.01); *H01L 2924/181* (2013.01); *H01L 2924/207* (2013.01); *H01L 2924/3511* (2013.01)

(56) References Cited

U.S. PATENT DOCUMENTS

| | | |
|---|---|---|
| 2009/0140415 A1 | 6/2009 | Furuta |
| 2011/0316147 A1 | 12/2011 | Shih et al. |
| 2013/0147041 A1 | 6/2013 | Chan et al. |
| 2013/0161836 A1* | 6/2013 | Yeom ............... H01L 25/105 257/778 |
| 2013/0168856 A1 | 7/2013 | Wang et al. |
| 2013/0214431 A1 | 8/2013 | Lin et al. |
| 2013/0249115 A1 | 9/2013 | Lin et al. |
| 2014/0124937 A1 | 5/2014 | Wu |
| 2014/0183732 A1* | 7/2014 | Huang ............. H01L 23/3135 257/738 |
| 2014/0264857 A1 | 9/2014 | Wu |

* cited by examiner

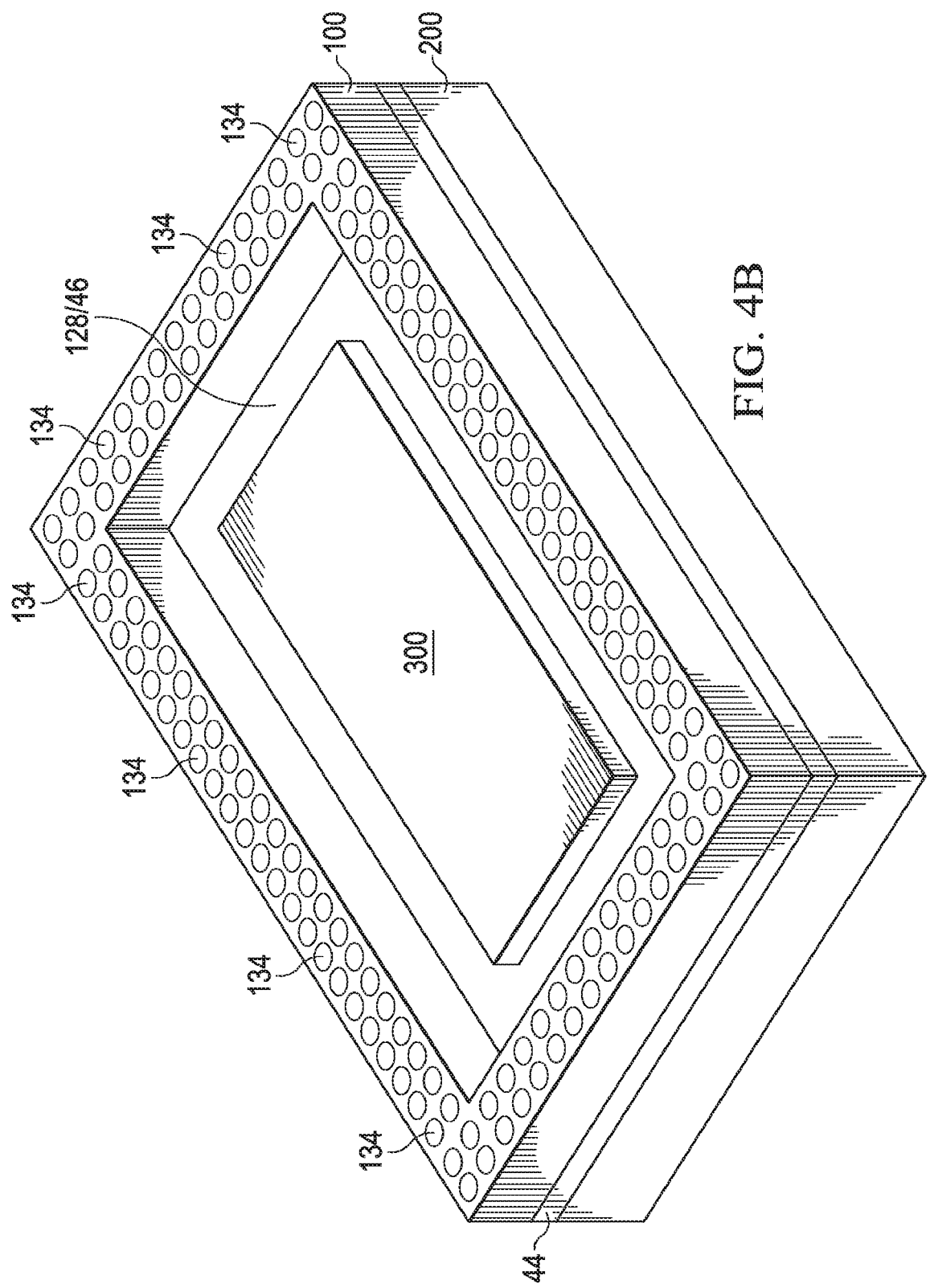

PACKAGE-ON-PACKAGE WITH CAVITY IN INTERPOSER

PRIORITY CLAIM AND CROSS-REFERENCE

This application is a continuation of U.S. patent application Ser. No. 14/819,006 entitled "Package-on-Package with Cavity in Interposer," filed Aug. 5, 2015, which is a continuation of U.S. patent application Ser. No. 14/158,295 entitled "Package-on-Package with Cavity in Interposer," filed Jan. 17, 2014, now U.S. Pat. No. 9,111,930 issued Aug. 18, 2015, which application claims the benefit of the following provisionally filed U.S. Patent application: Application Ser. No. 61/778,241, filed Mar. 12, 2013, and entitled "Package-on-Package with Cavity in Interposer;" which applications are hereby incorporated herein by reference.

BACKGROUND

In a conventional Package-on-Package (PoP) process, a top package is bonded to a bottom package. The top package and the bottom package are pre-formed before bonded to each other. The top package and the bottom package may also have device dies therein. By adopting the PoP process, the integration level of the packages may be increased.

In an existing PoP process, the formation of the bottom package includes bonding a device die to a package substrate. A molding compound is then molded on the package substrate, wherein the device die is molded in the molding compound. The package substrate further includes solder balls formed thereon, wherein the solder balls and the device die are on a same side of the package substrate. The solder balls are used for bonding the top package to the bottom package. Accordingly, to allow an adequate space for the device die, the heights of the solder balls need to be greater than the thickness of the device die, so that the top portions of the solder balls may protrude higher than the top surface of the device die, and higher than the top surface of the molding compound. Accordingly, the sizes of the solder balls are also large, and the number of the solder balls that can be used in a PoP structure is limited. In addition, with the large solder balls, the distance between neighboring solder balls also needs to be increased to prevent bridging.

Furthermore, the top package may also include solder regions formed thereon in order to connect to the solder balls in the bottom package. The large size of the solder balls and the additional solder from the top package makes it very difficult to prevent the bridging of solder balls while maintain the pitches of the solder balls to be small at the same time.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A Package-On-Package (POP) structure and the method of forming the same are provided in accordance with various exemplary embodiments. The intermediate stages of forming the package are illustrated. The variations of the embodiments are discussed. Throughout the various views and illustrative embodiments, like reference numbers are used to designate like elements.

Figure 1:
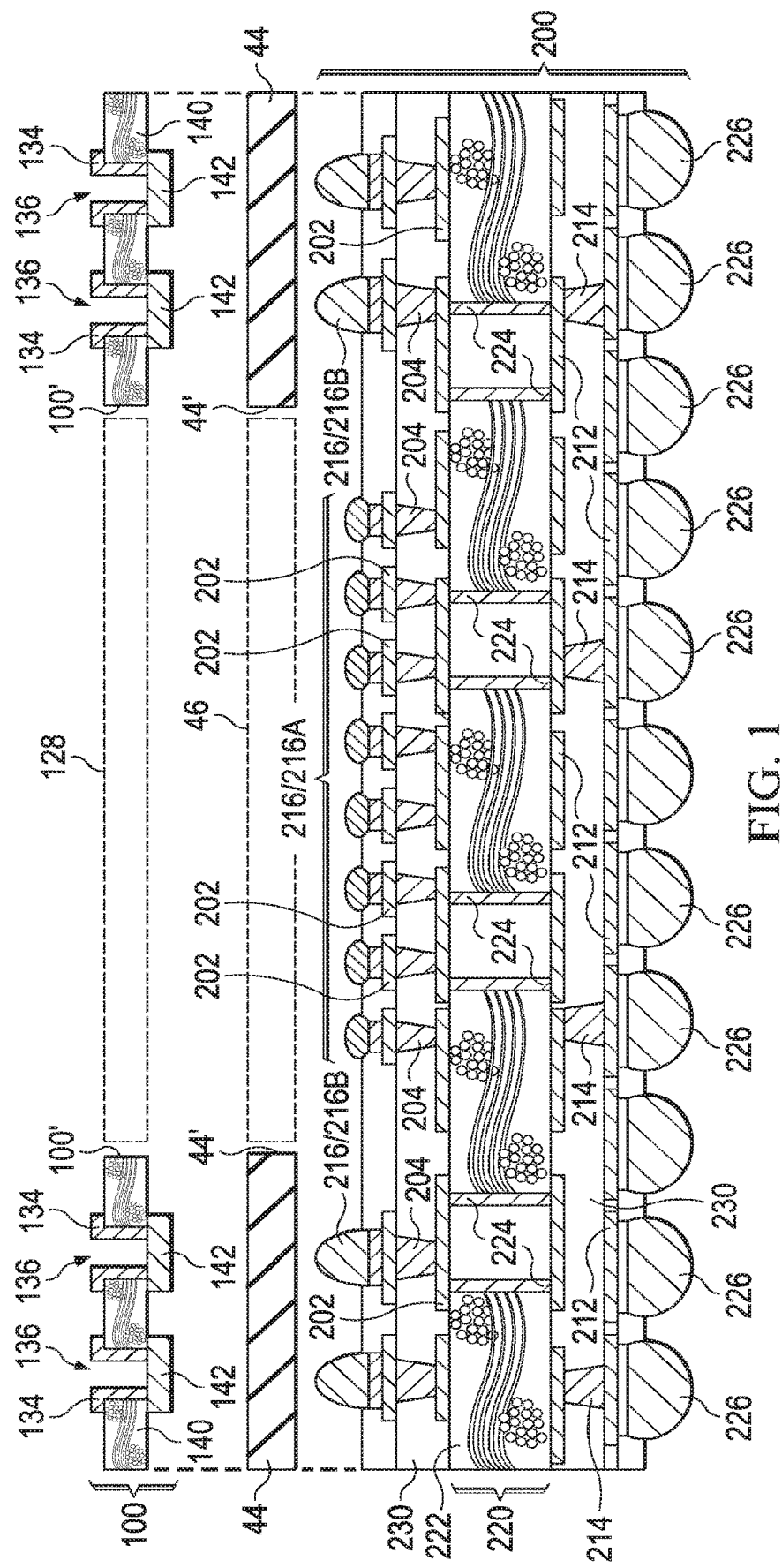
FIGS. 1 through 6 are cross-sectional views and perspective views of intermediate stages in the manufacturing of a Package-on-Package (POP) structure in accordance with some exemplary embodiments.

FIGS. 1 through 6 are cross-sectional views and perspective views of intermediate stages in the manufacturing of a POP structure in accordance with some exemplary embodiments. FIG. 1 illustrates a cross-sectional view in the bonding of interposer 100 to package component 200.

Package component 200 may be a package substrate. In some embodiments, package component 200 is a core-substrate including a core and dielectric layers on opposite sides of the core, wherein redistribution lines are disposed in the dielectric layers. In alternative embodiments, package component 200 is a laminate substrate, which comprises dielectric layers laminated together, and redistribution lines in the dielectric layers. FIG. 1 illustrates an exemplary core-substrate. As shown in FIG. 1, package component 200 may include metal lines 202/212 and vias 204/214 for interconnecting metal features on the opposite sides of package component 200. Metal lines 202 are also referred to as metal traces 202 hereinafter. In some embodiments, electrical connectors 216 (including 216A and 216B) and metal traces 202, which are formed on the topside of package component 200, are electrically coupled to electrical connectors 226, which are on the bottom side of package component 200. The interconnection may be made through electrical connectors 224. Connectors 216 and 226 may be solder balls, for example.

In some exemplary embodiments, package component 200 includes core 220, which further includes dielectric substrate 222 and electrical connectors 224 penetrating through dielectric substrate 222. In some embodiments, substrate 222 is formed of fiber glass. In alternative embodiments, substrate 222 is formed of other dielectric materials such as epoxy, resin, glass fiber, prepreg (which comprises epoxy, resin, and/or glass fiber), resin coated Copper (RCC), glass, molding compound, plastic (such as PolyVinylChloride (PVC), Acrylonitril, Butadiene & Styrene (ABS), Polypropylene (PP), Polyethylene (PE), PolyStyrene (PS), Polymethyl Methacrylate (PMMA), Polyethylene Terephthalate (PET), Polycarbonates (PC), Polyphenylene sulfide (PPS), flex (polyimide), combinations thereof, and multi-layers thereof. Metal lines 202/212 and vias 204/214 may be formed in dielectric layers 230. It is realized that package component 200 may have various other structures. For example, package component 200 may not include core 220.

Interposer 100, which is to be bonded to package component 200, includes core dielectric material 140. In some exemplary embodiments, core dielectric material 140 comprises one or more material selected from epoxy, resin, glass fiber, prepreg (which comprises epoxy, resin, and/or glass fiber), RCC, glass, molding compound, plastic (such PVC, ABS, PP, PE, PS, PMMA, PET, PC, PPS, flex (a polyimide), combinations thereof, and multi-layers thereof. Core material 140 may also be formed of Cu, alloy, silicon (in the form of silicon wafer), or the like. In which embodiments, however, since core material 140 is conductive or semi-conductive, insulation layers are needed to insulate the conductive features (such as conductive pipes 134) from core material 140.

Interposer 100 further includes conductive pipes 134 penetrating through core dielectric material 140. Each of conductive pipes 134 forms a ring encircling one of openings 136. Conductive pipes 134 may comprise copper, aluminum, tungsten, nickel, or other conductive materials. Metal pads 142 are formed underlying conductive pipes 134. Each of metal pads 142 includes a center portion aligned to the respective openings 136. The center portions of metal pads 142 are exposed to openings 136. Each of metal pads 142 also includes an outer portion aligned to, and connected to, the respective conductive pipe 134. Furthermore, the outer portions of metal pads 142 are in physical contact with conductive pipes 134.

Interposer 100 also includes through-opening 128 therein, which may be located in a center region of interposer 100. Through-opening 128 penetrates through core material 140. Through-opening 128 is large enough to accommodate a device die therein.

Dielectric film 44 is disposed between interposer 100 and package component 200. In some embodiments, dielectric film 44 comprises a soft dielectric material. For example, dielectric film 44 may comprise resin, plastic, glass fiber, or the like. The top view size of dielectric film 44 may be similar to the top view size of interposer 100, for example, as shown in FIG. 4B. As shown in FIG. 1, dielectric film 44 further includes through-opening 46, which may be at the center region of dielectric film 44. Through-opening 46 may have a size similar to the size of through-opening 128. When dielectric film 44 is aligned to interposer 100, the edges 100' of interposer 100 and edges 44' may also be aligned with each other in the vertical direction.

Figure 2:
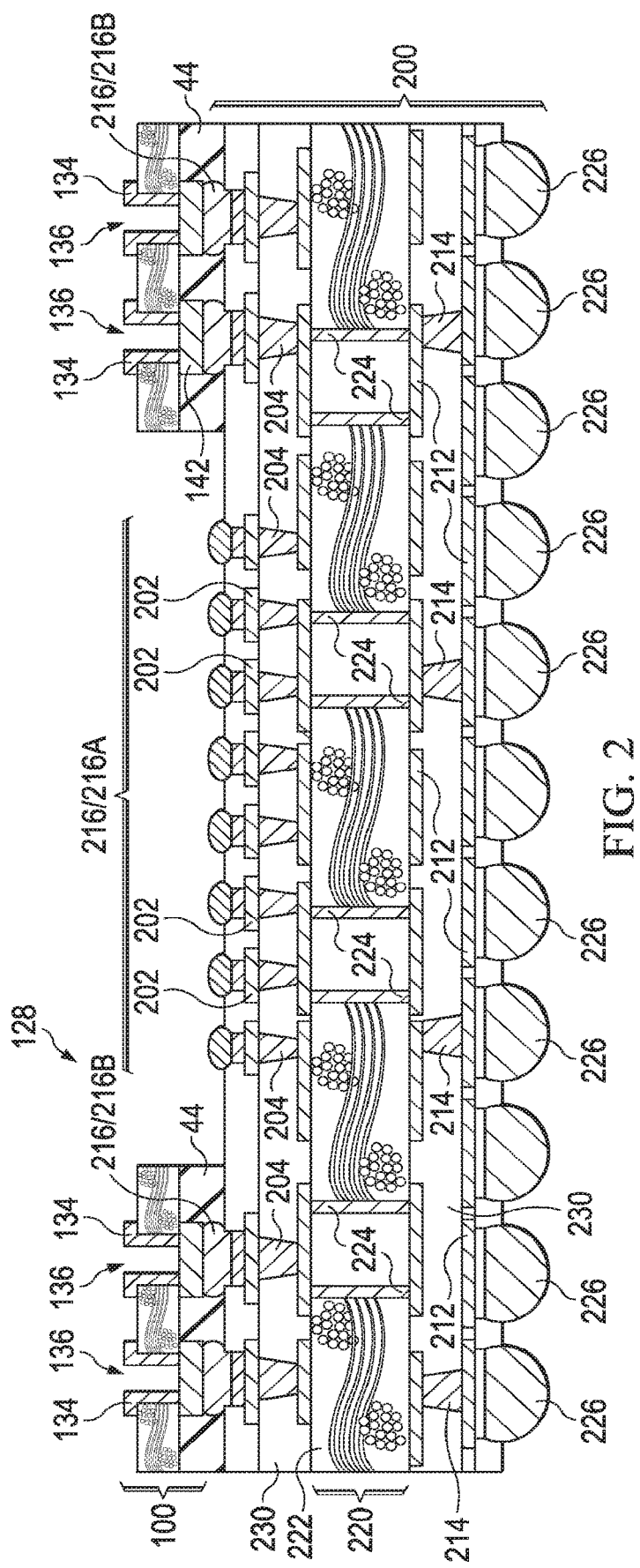

Referring to FIG. 2, interposer 100 is bonded to package component 200, wherein interposer 100 is pressed down against dielectric film 44 and package component 200. In some embodiments, dielectric film 44 includes pre-formed openings (not shown, occupied by solder balls 216B) aligned to solder balls 216B, and solder balls 216B penetrate through the openings. In alternative embodiments, no openings are pre-formed in dielectric film 44, and solder balls 216B are pressed through dielectric film 44. Solder balls 216B are hence in physical contact with metal pads 142. Next, interposer 100 and package component 200 are heated, and solder balls 216B are reflowed to bond interposer 100 to package component 200. Solder balls 216B, after being reflowed, are referred to as solder regions 216B throughout the description.

As shown in FIG. 2, solder regions 216B may be in physical contact with, and are electrically connected to, metal pads 142. Furthermore, solder regions 216B may be at least partially, or in entirety, overlap the respective overlying openings 136 (and hence overlap the center portions of metal pads 142). Accordingly, different from conventional core-substrate structures, solder regions 216B may utilize the space directly underlying openings 136.

Figure 3:
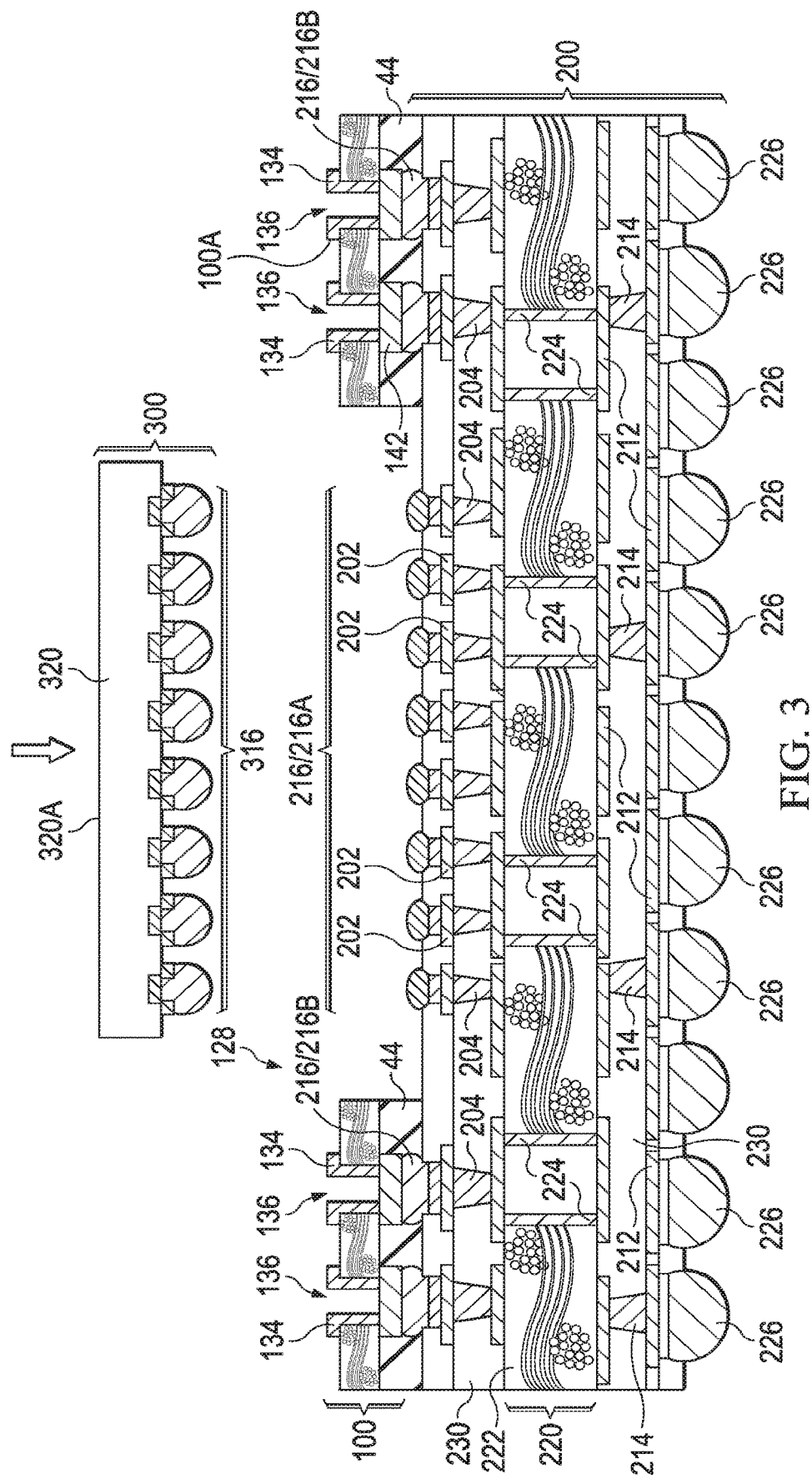

Referring to FIG. 3, device die 300 is placed in (as represented by arrow 310) through-opening 128, and bonded to electrical connectors 216A. In some embodiments, connectors 216A comprise a solder. In alternative embodiments, connectors 216A comprise metal pillars and solder caps on solder pillars. Device die 300 may be a logic die, a memory die, or the like, which comprises transistors (not shown) therein. In some exemplary embodiments, device die 300 is a Central Processing Unit (CPU) die. In alternative embodiments, component 300 is a package, which includes, for example, a device die (not shown) bonded to an interposer (not shown). As shown in FIG. 3, device die 300 is dispensed facing down, and electrical connectors 316 are on the bottom side of device die 300, and are aligned to connectors 216A. In some exemplary embodiments, electrical connectors 316 are metal pads, metal pillars (metal bumps), and/or the like. In alternative embodiments, electrical connectors 316 are solder balls. Electrical connectors 316 are electrically coupled to the integrated circuit devices (not shown) inside device die 300. Device die 300 may also include semiconductor substrate 320, which has back surface 320A that faces up.

Figure 4A:
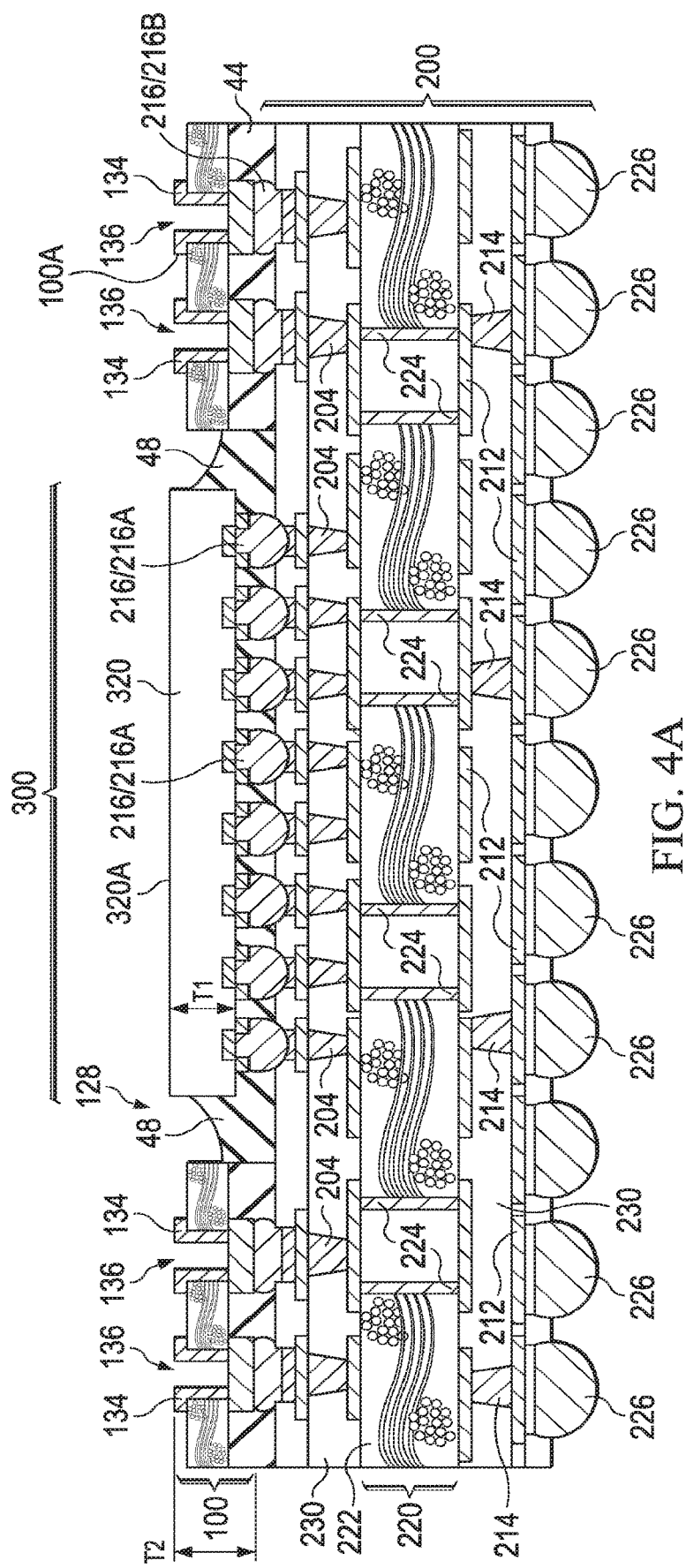

After connectors 216 and 316 are put into contact, a reflow is performed to melt the solder in connectors 216 and 316, so that device die 300 is bonded to package substrate 200. The resulting structure is shown in FIG. 4A, After the bonding process, back surface 320A may be lower than, level with, or higher than back surface 100A of interposer 100. Hence, thickness T1 of device die 300 may be substantially equal to, smaller than, or greater than thickness T2 of interposer 100.

FIG. 4A also illustrates the dispensing of underfill 48 into the gap between package component 200 and device die 300. Underfill 48 is then cured. FIG. 4B illustrates a perspective view of the structure shown in FIG. 4A. As shown in FIG. 4B, interposer 100 includes portions forming a full ring encircle device die 300, and package component 200 is bonded under device die 300 and interposer 100.

In the embodiments shown in FIGS. 1 through 4B, interposer 100 is bonded to package substrate 200 first, and then device die 300 is bonded to package substrate 200. In alternative embodiments, the bonding order is reversed, and device die 300 is bonded to package substrate 200 first. Interposer 100 is then bonded to package substrate 200.

Figure 5:
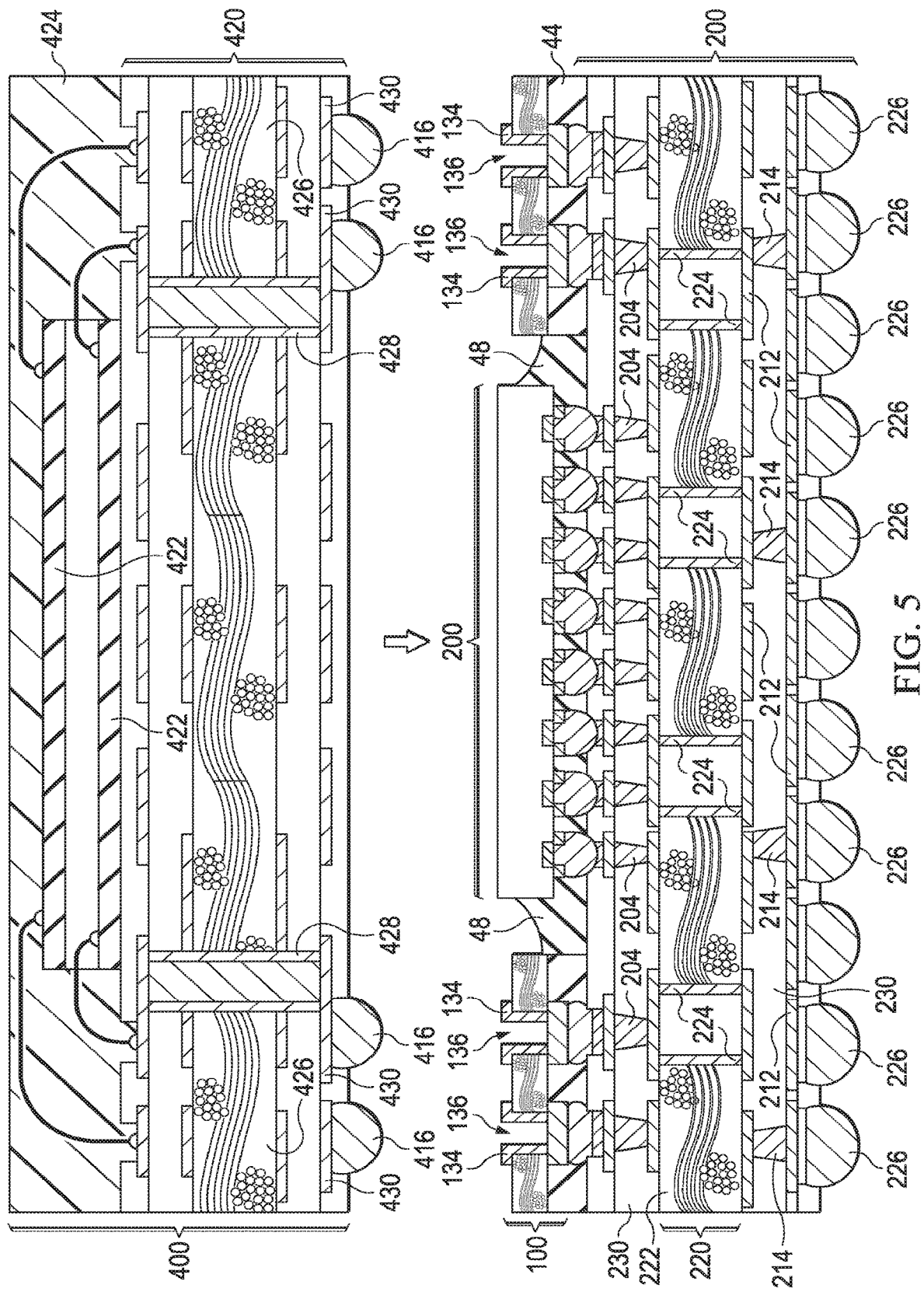
Figure 6:
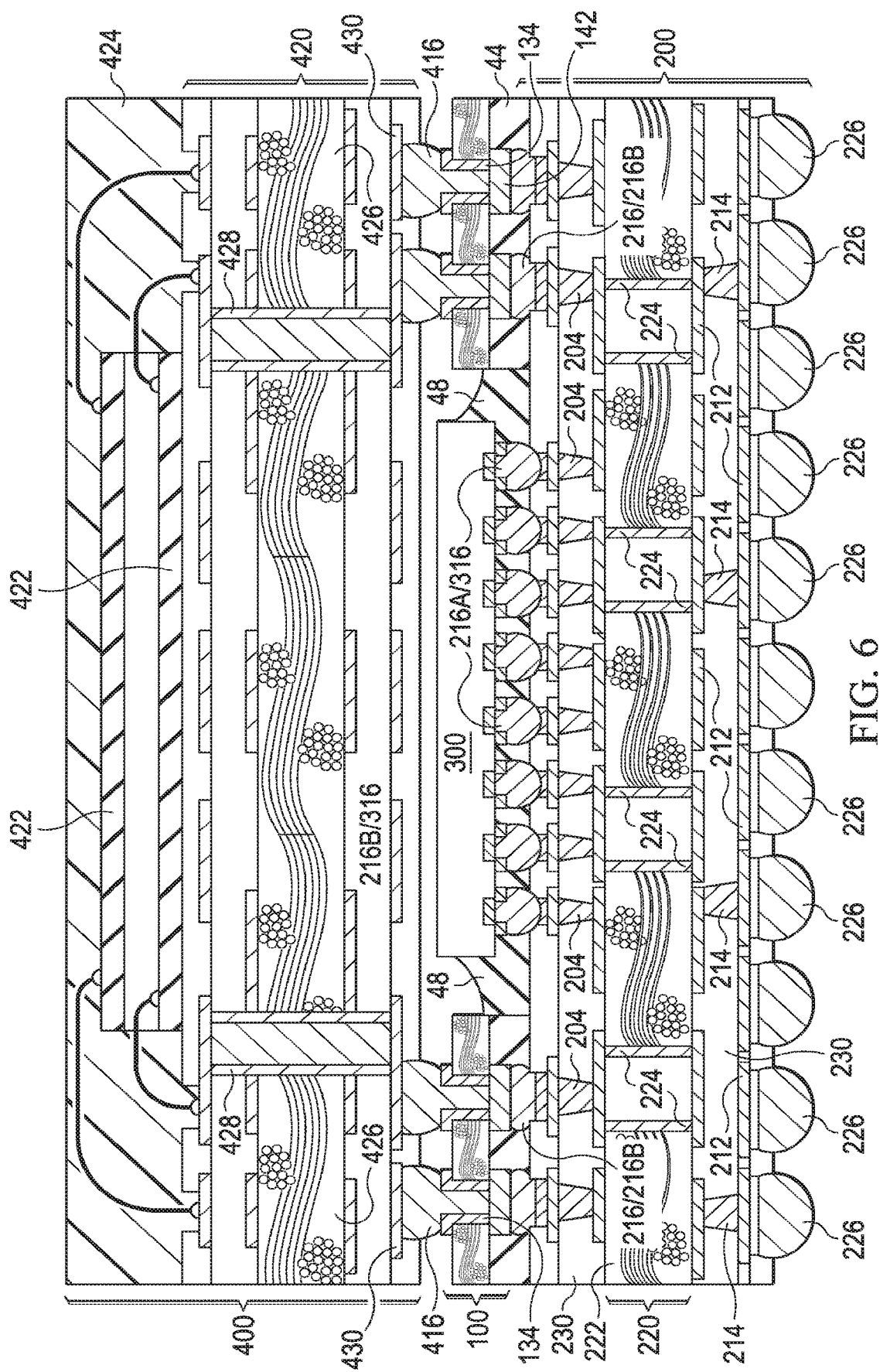

FIGS. 5 and 6 illustrate the bonding of top package 400 to interposer 100. Referring to FIG. 5, top package 400 is placed against interposer 100. Top package 400 may be a package that includes device dies 422 and package substrate 420, wherein device dies 422 are bonded to package substrate 420. In some exemplary embodiments, device dies 422 comprise memory dies such as Static Random Access Memory (SRAM) dies, Dynamic Random Access Memory (DRAM) dies, or the like. Furthermore, molding material 424 may be pre-molded on device dies 422 and package substrate 420 before the bonding of top package 400 to interposer 100. In alternative embodiments, package substrate 420 is bonded to interposer 100 first, and then device dies 422 are bonded to package substrate 420. Molding material 424 is then molded onto device dies 422 and package substrate 420.

Package substrate 420 may include core material 426, vias 428 penetrating through core material 426, and metal pads 430 connected to vias 428. In some exemplary embodiments, metal pads 430 are misaligned with the respective connecting vias 428. In some embodiments, solder balls 416 are mounted on metal pads 142, and are aligned to openings 136 of conductive pipes 134. The sizes of solder balls 416 is controlled so that the amount of solder in solder balls 416 may fill up openings 136 without too much excess.

Referring to FIG. 6, a reflow is performed to bond top package 400 to interposer 100. Solder regions 416, which are formed of the molten solder balls 416 in FIG. 6, fill openings 136, and electrically couple the circuits and conductive features in top package 400 to conductive pipes 134. In the resulting structure, metal pads 142 may have opposite surfaces that are bonded to solder regions 416 and 216. Furthermore, solder regions 416 and 216 may be aligned to each other in the vertical direction, and may be aligned to the center regions of the respective metal pads 142.

When top package 400 is bonded to interposer 100, the lateral expansion of solder regions 416 is minimized due to the formation of conductive pipes 134, and the pitches of the solder regions 416 may be made small without causing the increase in the risk of bridging neighboring solder regions 416. In accordance with the embodiments of the present disclosure, the pitches between solder regions 416 may be smaller than about 150 μm.

In the embodiments of the present disclosure, a device die is embedded in the through-opening in an interposer, rather than formed on a side of an interposer as in the conventional packages. The Coefficient of Thermal Expansion (CTE) of the substrate (which may be formed of silicon, for example) of the device die may be significantly different from the CTE of the interposer, which may comprise organic materials. Hence, in conventional packages, there was a significant warpage in the result package due to the mismatched CTEs of the substrate of the device die and the interposer. In the embodiments of the present disclosure, however, since the device die is embedded in the through-opening in the interposer, there is no CTE mismatch occurring to the opposite sides of the interposer. In addition, the using of the interposer makes the reduction of the size of solder regions possible, which solder regions connect the top package to the package substrate. Also, the reliability of the embodiments is high. Experiment results indicated that the packages formed in accordance with the embodiments of the present disclosure have a higher assembly yield, and the reliability in temperature cycle test and drop test is improved over conventional POP structures.

In accordance with some embodiments, a package includes an interposer, which includes a core dielectric material, a through-opening extending from a top surface to a bottom surface of the core dielectric material, a conductive pipe penetrating through the core dielectric material, and a device die in the through-opening. The device die includes electrical connectors. A top package is disposed over the interposer. A first solder region bonds the top package to the conductive pipe, wherein the first solder region extends into an opening of the conductive pipe. A package substrate is underlying the interposer. A second solder region bonds the package substrate to the interposer.

In accordance with other embodiments, an interposer includes a core dielectric material, a conductive pipe penetrating through the core dielectric material, and a metal pad underlying the conductive pipe. The metal pad includes a center portion overlapped by a region encircled by the conductive pipe, and an outer portion in contact with the conductive pipe. A solder region is underlying and bonded to the metal pad.

In accordance with yet other embodiments, a method includes bonding an interposer to a package substrate. The interposer includes a core dielectric material, a conductive pipe penetrating through the core dielectric material, and a metal pad underlying the conductive pipe. The metal pad includes a center portion overlapping an opening encircled by the conductive pipe, and an outer portion in contact with the conductive pipe. A die is bonded to the package substrate, wherein the die is dispensed in a through-opening of the interposer. A top package is bonded to the interposer, wherein a solder region bonds the top package to the conductive pipe, and wherein the solder region includes a portion filling the region encircled by the conductive pipe.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package comprising:
   a package substrate;
   a device die over and bonded to the package substrate;
   an interposer over the package substrate, the interposer comprising:
     a core dielectric material; and
     a conductive pipe penetrating through the core dielectric material;
   a first solder region extending into a region encircled by the conductive pipe; and
   a second solder region bonding the package substrate to the interposer.

2. The package of claim 1, wherein the device die extends into the interposer to bond to the package substrate.

3. The package of claim 2, wherein the device die extends into a through-opening in the interposer, and the device die is spaced apart from inner edges of the interposer.

4. The package of claim 1 further comprising a dielectric film between the interposer and the package substrate, wherein the second solder region extends into the dielectric film.

5. The package of claim 4, wherein the dielectric film comprises curved sidewalls contacting sidewalls of the second solder region.

6. The package of claim 4, wherein the interposer further comprises a metal pad, and the metal pad extends into the dielectric film.

7. The package of claim 1, wherein the interposer further comprises a metal pad contacting a bottom end of the conductive pipe, and the first solder region contacts a top surface of the metal pad.

8. A package comprising:
   a package substrate;
   a device die over and bonded to the package substrate; and
   an interposer over the package substrate, wherein the interposer encircles the device die, and the interposer comprises:
     a core dielectric material;
     a conductive pipe penetrating through the core dielectric material; and
     a metal pad underlying the conductive pipe, wherein the metal pad is electrically coupled to the package substrate, and the metal pad comprises:
       a center portion overlapped by a region encircled by the conductive pipe; and
       an outer portion in contact with the conductive pipe.

9. The package of claim 8, wherein the interposer has inner edges physically spaced apart from edges of the device die.

10. The package of claim 8 further comprising:
a first solder region extending into the conductive pipe.

11. The package of claim 10, wherein the first solder region is in physical contact with a top surface of the metal pad.

12. The package of claim 8 further comprising:
a dielectric film underlying the interposer; and
a second solder region underlying and contacting the metal pad.

13. The package of claim 12, wherein both the metal pad and the second solder region extend into the dielectric film.

14. The package of claim 12, wherein the second solder region comprises curved sidewalls physically contacting sidewalls of the dielectric film.

15. A package comprising:
a package substrate;
a device die over and bonded to the package substrate;
an underfill comprising a first portion extending between the package substrate and the device die;
a top package over the device die and the package substrate;
a solder region electrically coupling the top package to the package substrate; and
a dielectric film, wherein inner edges of the dielectric film are in contact with the underfill, and the inner edges of the dielectric film are perpendicular to a major top surface of the package substrate, and form a full ring encircling the device die and the underfill, and wherein the full ring is a complete ring free from any break.

16. The package of claim 15, wherein the underfill comprises second portions having inner edges contacting edges of the device die.

17. The package of claim 15 further comprising an interposer over the dielectric film and underlying the top package, wherein the device die extends into the interposer.

18. The package of claim 17, wherein additional inner edges of the interposer are separated from the device die by the underfill.

19. The package of claim 17, wherein the interposer comprises a conductive pipe extending from a top surface to a bottom surface of the interposer, wherein the conductive pipe is hollow and encircles a space, and the solder region extends into the space encircled by the conductive pipe.

20. The package of claim 15, wherein the dielectric film comprises resin, plastic, or glass fiber.

\* \* \* \* \*